(12) United States Patent
Newton et al.

(10) Patent No.: US 8,841,983 B2
(45) Date of Patent: Sep. 23, 2014

(54) INDUCTOR STRUCTURE

(75) Inventors: Timothy John Newton, Suffolk (GB); Nicolas Sornin, La Tronche (FR); Johan Lucas Gertenbach, Cambridge (GB)

(73) Assignee: Cambridge Silicon Radio Limited, Cambridge (GB)

( * ) Notice: Subject to any disclaimer, the term of this patent is extended or adjusted under 35 U.S.C. 154(b) by 521 days.

(21) Appl. No.: 13/056,852

(22) PCT Filed: Aug. 27, 2009

(86) PCT No.: PCT/EP2009/061095
§ 371 (c)(1),
(2), (4) Date: Apr. 28, 2011

(87) PCT Pub. No.: WO2010/023254
PCT Pub. Date: Mar. 4, 2010

(65) Prior Publication Data
US 2011/0267164 A1    Nov. 3, 2011

(30) Foreign Application Priority Data
Aug. 29, 2008 (GB) .................................. 0815798.4

(51) Int. Cl.
| | |
|---|---|
| H01F 5/00 | (2006.01) |
| H01F 27/28 | (2006.01) |
| H01F 17/00 | (2006.01) |
| H01F 27/34 | (2006.01) |
| H01L 23/522 | (2006.01) |
| H01F 5/04 | (2006.01) |
| H01F 27/00 | (2006.01) |

(52) U.S. Cl.
CPC .......... *H01F 17/0006* (2013.01); *H01F 27/346* (2013.01); *H01F 5/04* (2013.01); *H01F 27/006* (2013.01); *H01L 23/5227* (2013.01)
USPC ............ 336/200; 336/188; 336/226; 336/232

(58) Field of Classification Search
USPC .................................. 336/188, 200, 226, 232
See application file for complete search history.

(56) References Cited

U.S. PATENT DOCUMENTS

| | | | |
|---|---|---|---|
| 5,451,914 | A | 9/1995 | Stengel |
| 5,477,204 | A | 12/1995 | Li |

(Continued)

FOREIGN PATENT DOCUMENTS

| | | |
|---|---|---|
| CN | 101185146 A | 5/2008 |
| CN | 101253585 A | 8/2008 |

(Continued)

OTHER PUBLICATIONS

Chinese Office Action dated Jul. 4, 2012, in corresponding Chinese application.

(Continued)

*Primary Examiner* — Tsz Chan
(74) *Attorney, Agent, or Firm* — Vorys, Sater, Seymour and Pease LLP; Vincent M DeLuca (57) ABSTRACT

An inductor structure comprising: a first loop and a second loop; a first feed line connected to a first end of the first loop and a second feed line connected to a first end of the second loop, each of the first and second feed lines extending through an area circumscribed by one of the first and second loops; and a crossover section adjacent to the first end of the first loop and the first end of the second loop, the crossover section coupling the first loop to the second loop so as to cause current flowing from the first feed line to the second feed line to circulate around the first loop in a first rotational direction and around the second loop in a second rotational direction opposite to the first rotational direction.

18 Claims, 7 Drawing Sheets

(56) References Cited

U.S. PATENT DOCUMENTS

| 5,618,777 | A | 4/1997 | Hey-Shipton | |
|---|---|---|---|---|
| 6,281,778 | B1 | 8/2001 | El-Sharawy et al. | |
| 6,320,491 | B1 * | 11/2001 | Gevorgian et al. | 336/200 |
| 2004/0222478 | A1 | 11/2004 | Zhang et al. | |
| 2005/0237144 | A1 * | 10/2005 | Einzinger et al. | 336/200 |
| 2006/0033602 | A1 * | 2/2006 | Mattsson | 336/200 |
| 2006/0226943 | A1 * | 10/2006 | Marques | 335/285 |

FOREIGN PATENT DOCUMENTS

| GB | 1485827 A | 9/1977 |
|---|---|---|
| GB | 2384564 A | 7/2003 |
| JP | 2006-32805 A | 2/2006 |
| JP | 2006032805 A * | 2/2006 |
| WO | 2004/012213 A1 | 2/2004 |
| WO | 2004040596 A1 | 5/2004 |
| WO | 2006-075217 A1 | 7/2006 |
| WO | 2006/105184 A1 | 10/2006 |

OTHER PUBLICATIONS

UK Combined Search and Examination Report dated Nov. 9, 2012, in corresponding UK patent application.

UK Search Report dated May 17, 2010 in corresponding GB application.

CN Search Report dated Aug. 12, 2013, in corresponding CN patent application.

* cited by examiner

INDUCTOR STRUCTURE

FIELD OF THE INVENTION

This invention relates to inductor structures, for example for use in voltage controlled oscillators (VCO). The present invention is particularly applicable to VCOs used in transceivers.

BACKGROUND OF THE INVENTION

Inductors are often used in environments in which they are surrounded by other circuitry. A problem with such inductors is that the magnetic fields they radiate may interfere with the operation of the surrounding circuitry. It is therefore desirable to configure an inductor to maximise the cancellation of its magnetic field components at distance. Other elements of circuitry positioned in suitable orientations at distance from the inductor would consequently suffer minimal interference as a result of the magnetic field radiated by the inductor.

One configuration of an inductor that has been designed to address this problem is in the shape of a figure-of-8. WO 2004/012213 describes such an inductor, shown schematically in FIG. 1. Current enters the inductor via a feed line 101 that runs outside the boundary of the figure-of-8 shape from its base to its upper loop. The current flows around the structure in the directions indicated by the arrows. The current exits the inductor via a feed line 102 which runs outside the boundary of the figure-of-8 shape from its lower loop to its base. As a result of the crossover section in the middle of the figure-of-8 structure, the current flows clockwise around the lower loop and anticlockwise around the upper loop. As indicated using conventional notation on FIG. 1, the magnetic field created by the current flowing clockwise around the lower loop is directed into the page and the magnetic field created by the current flowing anticlockwise around the upper loop is directed out of the page. The field lines join such that most of the magnetic field components in the plane of the inductor are contained within the area of the figure-of-8 structure. A degree of cancellation of the magnetic field components is therefore achieved at distance from the inductor in the plane of the inductor.

Total cancellation of the magnetic field components is theoretically possible along an axis which bisects a figure-of-8 inductor structure such that the lower loop is on one side of the axis and the upper loop is on the other side of the axis. Total cancellation is achieved when the size and shape of the two loops are identical and perfectly symmetrical about the axis. The magnetic field components radiated from the two loops would be equal in magnitude but opposite in direction. For such a structure, small residual magnetic field components would remain at distance from the structure everywhere except along the axis defined above.

Figure 1:
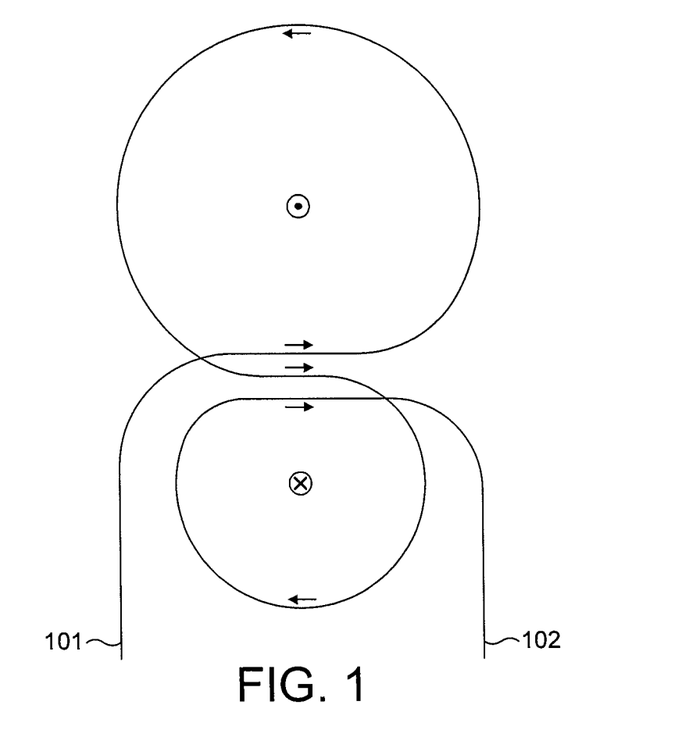
FIG. 1 is a schematic diagram of a prior art figure-of-8 inductor.

The inductor structure of FIG. 1 is not symmetrical about any axis defined in the plane of the inductor. The cancellation is further compromised in the design of FIG. 1 because the feed lines 101, 102 contribute to the magnetic field radiated by the lower loop. Partial compensation of this effect is achieved by reducing the area enclosed by the lower loop with respect to the area enclosed by the upper loop. Despite this, significant magnetic field components exist at distance from the inductor in all directions.

Figure 2:
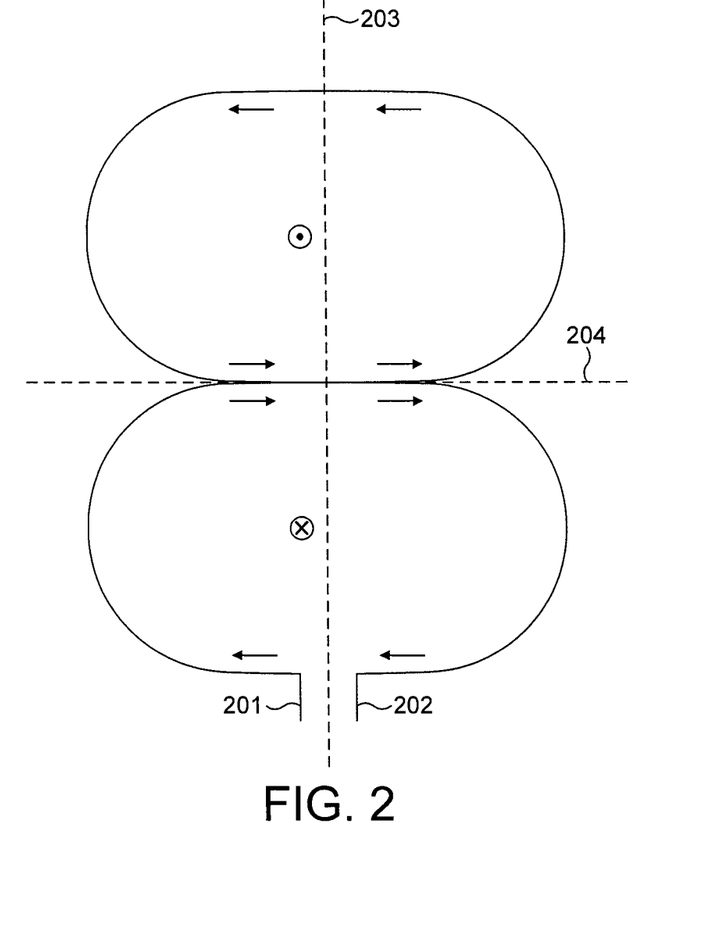
FIG. 2 is a schematic diagram of a further prior art figure-of-8 inductor.

U.S. Pat. No. 7,151,430 describes other figure-of-8 inductor designs, one of which is shown schematically in FIG. 2. Current enters the inductor via a feed line 201 at the base of the lower loop. The current flows around the figure-of-8 structure in the directions indicated by the arrows and exits the inductor via a feed line 202 also attached to the base of the lower loop. As in FIG. 1 the current flows clockwise around the lower loop and anticlockwise around the upper loop. The inductor structure of FIG. 2 is symmetrical about an axis 203 which bisects the figure-of-8 structure such that half of the lower loop and half of the upper loop are on one side of the axis and the other half of the lower loop and the other half of the upper loop are on the other side of the axis. As a result of the symmetry exhibited by the structure, the magnetic fields radiated by the two loops are better matched in some respects than in the inductor structure of FIG. 1.

The structure of FIG. 2 is not symmetrical about a second axis 204. This is because the feed lines 201, 202 are connected to two ends of the lower loop. The magnetic field radiated by the lower loop is skewed compared to the magnetic field radiated by the upper loop because of the close coupling between the two loops in the crossover section. Consequently, cancellation of the magnetic field components at distance from the inductor is compromised. Therefore a resultant magnetic field remains at distance from the inductor in all directions. This resultant magnetic field is capable of causing significant disturbance to the surrounding circuitry.

There is thus a need for an improved inductor design which reduces the resultant magnetic field at distance from the inductor.

SUMMARY OF THE INVENTION

According to a first embodiment of the invention, there is provided an inductor structure comprising a first loop and a second loop; a first feed line connected to a first end of the first loop and a second feed line connected to a first end of the second loop, each of the first and second feed lines extending through an area circumscribed by one of the first and second loops; and a crossover section adjacent to the first end of the first loop and the first end of the second loop, the crossover section coupling the first loop to the second loop so as to cause current flowing from the first feed line to the second feed line to circulate around the first loop in a first rotational direction and around the second loop in a second rotational direction opposite to the first rotational direction.

According to another embodiment of the invention, there is provided an inductor structure comprising: a first loop and a second loop; a first feed line connected to a first end of the first loop and a second feed line connected to a first end of the second loop, each of the first and second feed lines extending out of the plane of the inductor structure; and a crossover section adjacent to the first end of the first loop and the first end of the second loop, the crossover section coupling the first loop to the second loop so as to cause current flowing from the first feed line to the second feed line to circulate around the first loop in a first rotational direction and around the second loop in a second rotational direction opposite to the first rotational direction.

The first feed line may extend out of the plane of the inductor structure from the first end of the first loop. The second feed line may extend out of the plane of the inductor structure from the first end of the second loop.

The first feed line may extend through an area circumscribed by one of the first and second loops and the second feed line may extend through an area circumscribed by the other one of the first and second loops. Alternatively, the first feed line may extend through an area circumscribed by one of the first and second loops and the second feed line may extend through an area circumscribed by the same one of the first and second loops. Each of the first and second feed lines may extend through a single one of the first and second loops.

Furthermore, each of the first and second feed lines may extend to an exterior edge of the one of the first and second loops through which it extends.

Preferably, the area circumscribed by the first loop is equal to an area circumscribed by the second loop. Preferably, the first loop has identical size and shape to the second loop.

Preferably, the inductor structure is symmetrical about two axes. Suitably, the inductor structure is symmetrical about a first axis that bisects the inductor structure such that the first loop is on one side of the axis and the second loop is on a second side of the axis. Suitably, the inductor structure is symmetrical about a second axis that bisects the inductor structure such that a first half of the first loop and a first half of the second loop lie on one side of the second axis and a second half of the first loop and a second half of the second loop lie on a second side of the second axis.

The inductor structure may be of octagonal profile.

Each of the first and second loops may comprise a first turn and a second turn. For each of the loops the second turn may circumscribe the first turn.

Preferably, the crossover section lies in a central region of the inductor structure.

Suitably, the first loop and the second loop are connected to form a figure-of-8 shape.

Suitably, the inductor structure is formed by metallisation on a planar substrate.

According to a third embodiment of the invention, there is provided an integrated circuit including the inductor structure described above.

BRIEF DESCRIPTION OF THE DRAWINGS

The present invention will now be described by way of example with reference to the accompanying drawings. In the drawings.

DESCRIPTION OF THE PREFERRED EMBODIMENTS

Figure 3A:
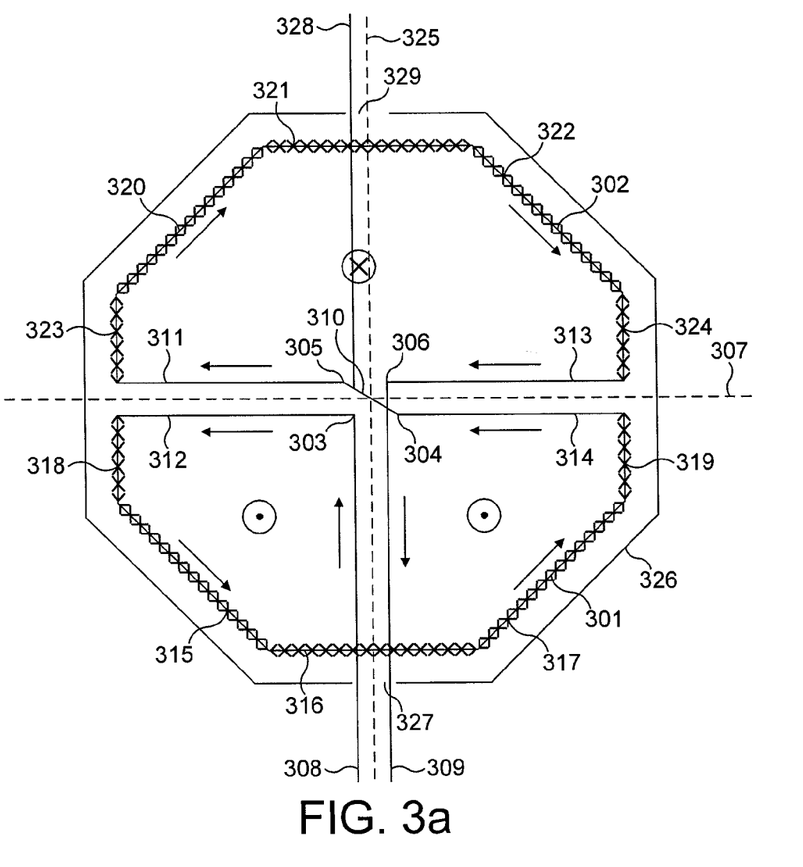
FIG. 3a is a schematic diagram of a figure-of-8 inductor according to an embodiment of the present invention that has one turn on each loop.

FIG. 3a shows a schematic diagram of the general arrangement of an inductor according to one embodiment of the present invention.

The inductor comprises two loops connected in a figure-of-8 arrangement. The two loops are identical. One feed line connects to one of the loops in the central region of the figure-of-8 structure. The other feed line connects to the other loop in the central region. The two feed lines extend parallel to each other through the area circumscribed by one of the loops. The inductor structure is symmetrical about two perpendicular axes in the plane of the inductor. The increased symmetry of the structure compared to prior art designs results in the magnetic field produced by the two loops of the figure-of-8 inductor more effectively cancelling at distance from the inductor, particularly along an axis which lies between the two loops.

It will be understood in the description that follows that the inductor structure is designed such that substantially complete cancellation of magnetic field components at distance is achieved along at least one axis. The characteristics described in the description are not intended to necessarily confer absolute cancellation of magnetic field components as a result of the inductor structure design. Consequently, references in the description to specific relative locations of parts of the inductor structure are to be interpreted to mean that those parts are to be located close enough to the specified location that substantial cancellation of magnetic field components at distance is achieved. Similarly, references to equalities of areas, sizes, shapes, lengths, magnetic fluxes or similar are to be interpreted to mean that the degree of similarity between the compared quantities is such that substantial cancellation of magnetic field components at distance is achieved. Similarly, references to the inductor structure or parts of the inductor structure being symmetrical about an axis are to be interpreted to include such structures or parts of structures that, although not exactly symmetrical about the axis, are close enough to exhibiting the mentioned symmetry that substantial cancellation of the magnetic field components at distance is achieved.

The inductor comprises a first loop 301 and a second loop 302 connected in a figure-of-8 arrangement. The first loop 301 is open and has two ends 303, 304. Similarly, the second loop 302 is open and has two ends 305, 306. All four ends of the loops 303, 304, 305, 306 lie in close proximity to each other and an axis 307. The axis 307 bisects the figure-of-8 structure such that the first loop is wholly on one side of the axis and the second loop is wholly on the other side. Preferably, the ends of the first loop 303, 304 and the ends of the second loop 305, 306 are at the centre of the figure-of-8 structure.

A first feed line 308 is connected to a first end of the first loop 303. A second feed line 309 is connected to a first end of the second loop 306. The feed lines extend through the area circumscribed by the first loop 301 to the exterior of the first loop where they cross the boundary of the figure-of-8 structure. In the embodiment of the invention shown in FIG. 3a, the feed lines lie parallel to each other. Preferably, the feed lines lie perpendicular to the axis 307 such that the area enclosed by the first loop 301 and the first feed line 308 is equal to the area enclosed by the first loop 301 and the second feed line 309.

Figure 3B:
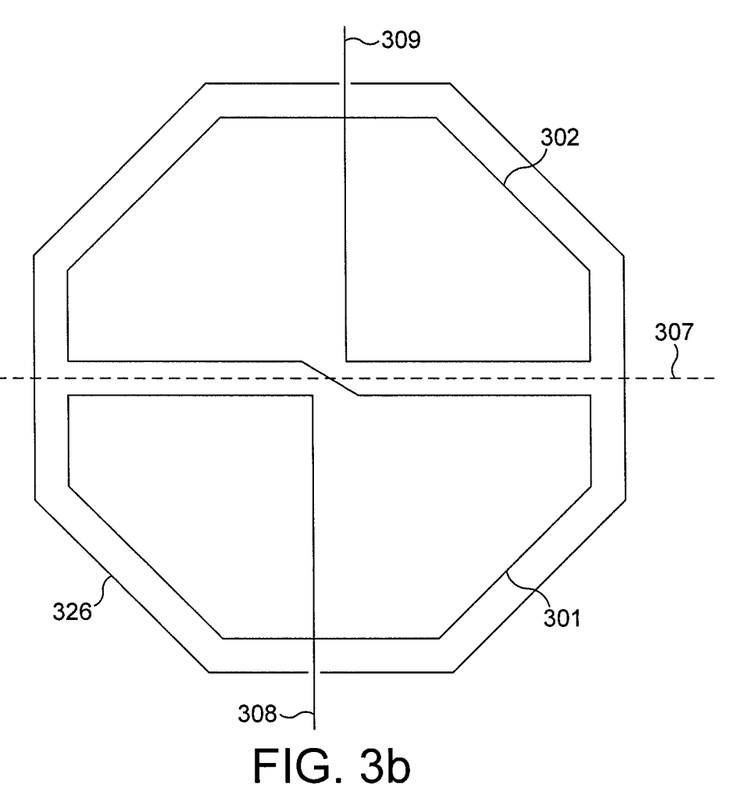
FIG. 3b is a schematic diagram of a figure-of-8 inductor according to another embodiment of the present invention.
Figure 3C:
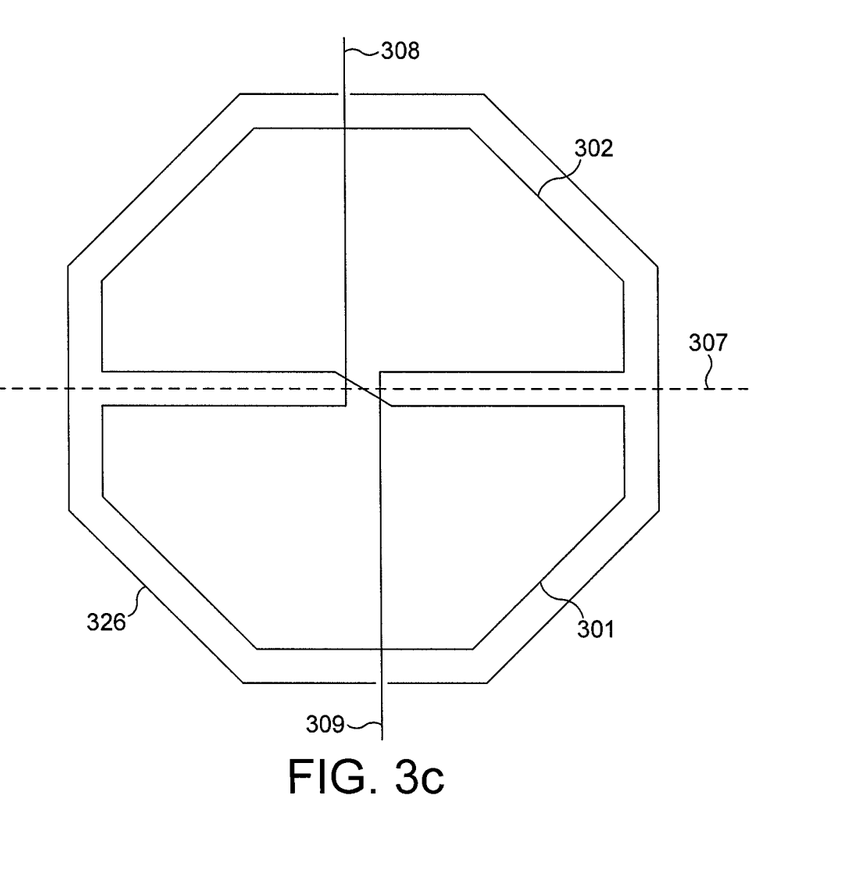
FIG. 3c is a schematic diagram of a figure-of-8 inductor according to a further embodiment of the present invention.
Figure 3D:
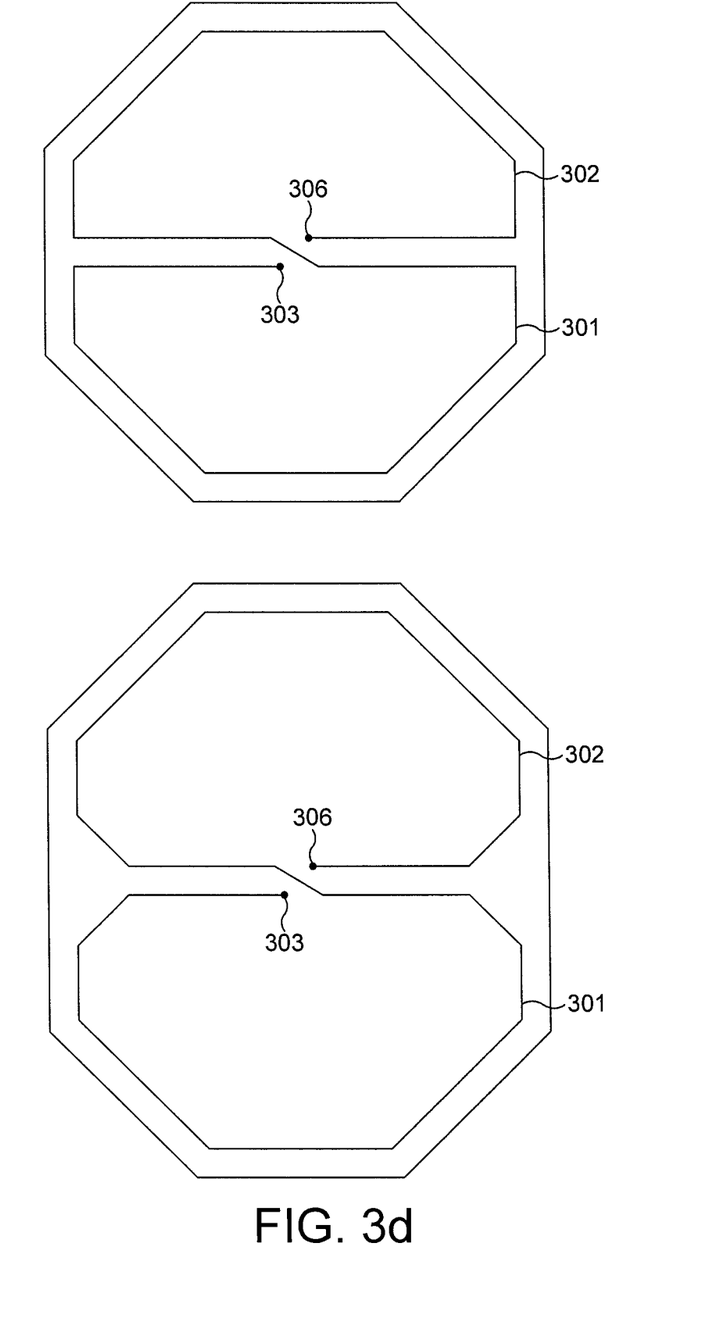
FIG. 3d is a schematic diagram of a figure-of-8 inductor fed from out of its plane.

FIGS. 3b, 3c and 3d show alternative positions of the feed lines according to further embodiments of the invention. In FIG. 3b, the first feed line 308 extends through the area circumscribed by the first loop 301 and the second feed line 309 extends through the area circumscribed by the second loop 302. Preferably, the feed lines lie perpendicular to the axis 307 such that the area enclosed by the first loop 301 and the first feed line 308 is equal to the area enclosed by the second loop 302 and the second feed line 309. The inductor structure of FIG. 3b is as described in relation to FIG. 3a except for the position of the feed lines and the shield 326 (described later) which requires a further aperture through which the second feed line 309 extends.

In FIG. 3c, the first feed line 308 extends through the area circumscribed by the second loop 302 and the second feed line 309 extends through the area circumscribed by the first loop 301. Preferably, the feed lines lie perpendicular to the axis 307 such that the area enclosed by the second loop 302 and the first feed line 308 is equal to the area enclosed by the first loop 301 and the second feed line 309. The inductor structure of FIG. 3c is as described in relation to FIG. 3a except for the position of the feed lines and the shield 326 (described later) which requires a further aperture through which the first feed line 308 extends.

In FIG. 3d, the feed lines extend out of the plane of the inductor.

Returning to FIG. 3a, the second end of the first loop 304 and the second end of the second loop 305 are coupled by a crossover section 310. In FIG. 3a, the crossover section 310 directly connects the second end of the first loop 304 to the second end of the second loop 305. The first end of the first loop 303 lies adjacent to the crossover section 310 on one side of the crossover section. The first end of the second loop 306 lies adjacent to the crossover section 310 on the other side of the crossover section. The crossover section 310 lies wholly within the central region of the figure-of-8 structure. In an embodiment of the invention, the central region is defined by a circle centred at the centre of the figure-of-8 structure with a radius less than xr. In this definition r is the average length of a straight line connecting the centre point of the figure-of-8 structure to the exterior edge of one of the loops. An exterior edge of a loop is an edge which forms a boundary between the interior and exterior of the figure-of-8 structure. In FIG. 3a, the exterior edges are shown by hatched lines. The exterior edges do not include facing edges of the two loops 311, 312, 313, 314 that are adjacent to the axis 307. Preferably x lies in the range ⅓ to ⅛. Most preferably x is ½.

The inductor operates using alternating current (a.c.). The following description describes the operation of the inductor when the current flows in a first direction from the first feed line 308 to the second feed line 309. It will be understood that when the current alternates such that it flows from the second feed line 309 to the first feed line 308, the converse operation to that described below applies.

Current enters the inductor via the first feed line 308. The current flows around the inductor in the directions indicated by the arrows on FIG. 3a. Current leaves the inductor via the second feed line 309. The first loop 301 and the second loop 302 are connected such that current flowing from the first feed line 308 to the second feed line 309 circulates in a first rotational direction around the first loop 301 and in a second opposite rotational direction around the second loop 302. In FIG. 3a, the current flows in an anticlockwise direction around the first loop 301 and in a clockwise direction around the second loop 302 as indicated by the arrows on the figure.

The shape and size of the first loop 301 is identical to the shape and size of the second loop 302. The area encompassed by each loop is consequently identical. In one embodiment of the invention, the figure-of-8 structure is of octagonal profile such that the exterior edges of the first loop are in the shape of half an octagon and the exterior edges of the second loop are in the shape of the other half of the octagon. Preferably, the half octagon of the first loop includes three sides of the octagon 315, 316, 317 and two half sides of the octagon 318, 319. The second loop has identically arranged octagonal sides including three sides of the octagon 320, 321, 322 and two half sides 323, 324. The remaining edges of the loops lie interior to the figure-of-8 structure and connect the exterior edges to the ends of the loops. In FIG. 3a, a first interior edge 312 connects the end point of the exterior edge 318 of the first loop 301 to the first end of the first loop 303. The end point of the exterior edge 318 is the point that lies closest to the axis 307 on the same side of the centre of the figure-of-8 structure as the first end of the first loop 303. Similarly, a second interior edge 314 connects the end point of the exterior edge 319 of the first loop 301 to the second end of the first loop 304.

Interior edges 311 and 313 are similarly defined for the second loop 302. Preferably, the interior edges 311, 312, 313 and 314 are straight lines. Preferably, they are parallel to each other and the axis 307. In an alternative embodiment of the invention, the figure-of-8 structure has a four-sided profile, for example a square profile. In such an embodiment, the exterior edges are arranged in a similar manner to the exterior edges of the octagonal profile of FIG. 3a, wherein the exterior edges of the first loop are in the shape of half a square and the exterior edges of the second loop are in the shape of the other half of the square. An octagonal profile may be preferred over a four-sided profile because the octagonal profile uses a smaller area on chip to achieve a similar inductance and Q-value (quality value). The octagonal profile inductor advantageously frees up space for other components on chip compared to the four-sided profile inductor.

Magnetic flux is a term used to quantify the magnetic field acting over an area. Magnetic flux is a measure of the number of magnetic field lines that pass through a given area. In simplified terms the magnetic flux generated through a given area is proportional to the component of the magnetic flux density that is perpendicular to the area in question multiplied by the area.

$$\phi \propto B*S$$

Where φ is the magnetic flux, B is the magnetic flux density component perpendicular to the area and S is the area. The magnetic flux density, B, is proportional to the magnetic field, H.

The magnetic flux density is dependent on the length of the inductor.

Since the flux generated by a loop is dependent on the area encompassed by the loop and the length of the inductor in the loop, the two loops of a figure-of-8 inductor generate identical fluxes when they have identical areas and use identical lengths of inductor. In FIG. 3a, the first loop 301 and the second loop 302 encompass equal areas and use equal lengths of inductor. The magnetic flux through each loop is equal. Consequently, the magnetic field components generated by each loop that are present along the axis 307 cancel. Additionally, the resultant magnetic field produced at distance from the inductor in directions other than along the axis 307 is reduced.

The first and second loops 301, 302 are identical to each other and the two feed lines 308, 309 are connected to the first and second loops in the centre of the figure-of-8 structure. Consequently, a higher degree of symmetry exists in the overall figure-of-8 structure than in previous designs. The inductor is symmetrical about a first axis 307. The inductor is also symmetrical about a second axis 325 which bisects the figure-of-8 structure such that half of the lower loop and half of the upper loop are on one side of the axis and the other half of the lower loop and the other half of the upper loop are on the other side of the axis. The second axis 325 lies perpendicular to the first axis 307 and crosses the first axis 307 at the centre of the figure-of-8 structure. The inductor is symmetrical about two axes compared to the prior art design of FIG. 2 that is only symmetrical about one axis. The arrangement of the first and second loops of the present invention are better matched than the loops of the prior art. Consequently, the magnetic field components radiated by the first loop 301 of the inductor of the present invention are more equally matched in magnitude but opposite in direction to the magnetic field components radiated by the second loop 302, compared to the prior art designs. At distance from the inductor, a higher degree of cancellation of the magnetic field components is correspondingly achieved than in the prior art designs, particularly along the first axis 307. "At distance" from the inductor means at distances of at least 10r, where r is as previously defined. Preferably "at distance" means at distances of at least 5r. Most preferably "at distance" means at distances of at least r.

In the embodiment of FIG. 3a current flows in the first feed line 308 in one direction and in the second feed line 309 in the opposite direction. The magnetic field generated by the first feed line 308 is equal in magnitude but opposite in direction to the magnetic field generated by the second feed line 309 if the feed lines are parallel. If the feed lines are approximated as occupying the same position, then their respective magnetic field contributions cancel each other and they make no contribution to the inductance. However, the feed lines of FIG. 3a do not occupy the exact same position and consequently they collectively provide a small magnetic field contribution. This is contained wholly within the area of the first loop 301. The feed lines add to the resistance of the inductor structure which reduces the Q factor (quality factor) of the structure.

In the embodiments of FIG. 3b and FIG. 3c, the current flows in the same direction in both the first feed line 308 and the second feed line 309. The magnetic field generated by the first feed line 308 is equal in magnitude and in the same direction as the magnetic field generated by the second feed line 309 if the feed lines are parallel. Consequently, the overall magnetic field cancellation achieved at distance will be limited by the combined magnetic field contributions of each feed line.

In the embodiment of FIG. 3d, the feed lines lie in a different plane to the plane of the inductor. The loops may be generally in the shape of a regular octagon, or include five sides of a regular octagon and a sixth side, or may be of any other suitable form. The loops 301, 302 are fed from the centre of the inductor structure from out of the plane of the inductor. To achieve this, the inductor may be formed in one layer of metallisation, and the feed lines can extend out of the plane of that layer. Conveniently the feed lines can terminate at active devices that are in a semiconductor substrate on which the metallisation is formed. The feed lines join the loops at points 303, 306, which could be posts or vias extending perpendicular to the plane in which the inductor is formed. The feed lines extend into or out of the plane of FIG. 3d.

The embodiment of FIG. 3d has the advantage that the feed lines can be shortened since they need not extend to the periphery of the loops of the inductor. This allows the quality factor of the inductor structure (to which the feed lines do not contribute) to be increased relative to its resistance.

In the embodiments of FIG. 3d the feed lines extend out of the plane directly from their attachment points to the loops. The feed lines could extend partially in the plane of the inductor and then extend perpendicular to the plane.

The inductor may be surrounded by a shield 326. Preferably the shield is octagonal. The feed lines extend through a small aperture 327 in one edge of the shield 326. Preferably, the aperture 327 is positioned such that the feed lines pass through the shield in a straight line from their connections to the inductor.

The inductor structure may further comprise a tap 328. The tap 328 connects the inductor to a supply voltage. One end of the tap is connected to the crossover section 310 of the inductor. The tap 328 extends from the crossover section 310 through the area circumscribed by the second loop 302 to the exterior of the second loop 302 where it crosses the boundary of the figure-of-8 structure. If the crossover section 310 lies at the central region of the figure-of-8 then the tap is referred to as a centre tap. Preferably the tap runs in a straight line parallel to the feed lines 308, 309. The tap extends through a further aperture 329 in the shield 326.

Figure 4:
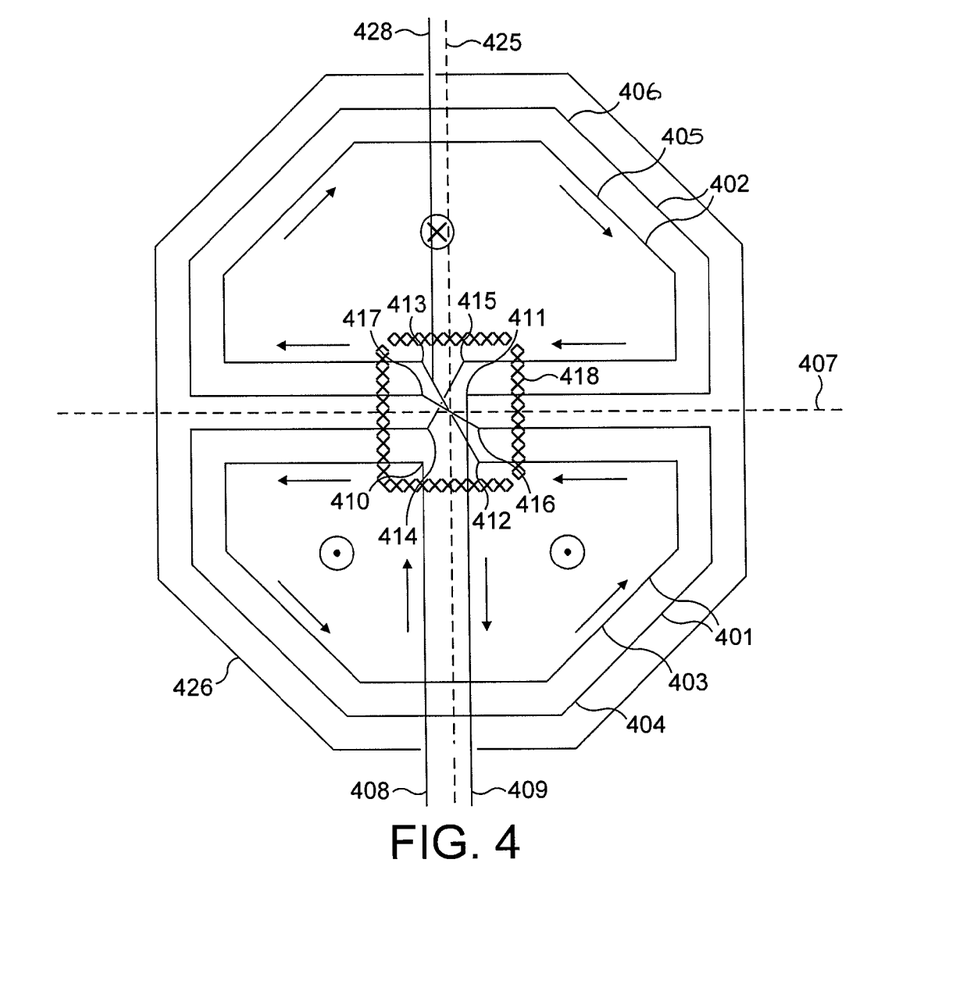
FIG. 4 is a schematic diagram of a figure-of-8 inductor according to an embodiment of the present invention that has two turns on each loop.

FIG. 4 depicts a further embodiment of the invention in which a higher inductance value is obtained by increasing the length of the inductor. This could be achieved using the inductor layout of FIG. 3a. However, if the inductor is fabricated on a chip it is desirable to limit the chip area required by the inductor. The arrangement of FIG. 4 is similar to that of FIG. 3a except that each of the first and second loops consists of two turns. The inductor length is consequently increased yielding a significantly higher inductance value without a corresponding significant increase in chip area consumed.

In the embodiment of FIG. 4, the first loop 401 comprises a first turn 403 and a second turn 404. The second turn 404 runs parallel to the first turn 403. The second turn 404 runs outside the first turn 403 such that the second turn 404 forms a boundary between the first turn 403 and the exterior of the figure-of-8 structure, and the first turn 403 forms a boundary between the second turn 404 and the interior of the figure-of-8 structure. The first and second turns do not cross over each other at an exterior edge of the figure-of-8 structure. Preferably, the first and second turns of the first loop have the same octagonal profile as described in relation to FIG. 3a. The second loop 402 is identically arranged to the first loop 401 comprising a first turn 405 and a second turn 406.

The first feed line 408 is connected to a first end of the first loop 410 which is a first end of the first turn of the first loop. The second feed line 409 is connected to a first end of the second loop 411 which is a first end of the second turn of the second loop. The feed lines extend through the area encompassed by the first loop in the same manner as described in relation to FIG. 3a. In alternative embodiments, the feed lines may be positioned as described in relation to FIGS. 3b, 3c and 3d.

The crossover section 418, depicted by the area enclosed within the hatched lines couples the first loop 401 to the second loop 402. In FIG. 4, the crossover section is in the central region of the figure-of-8. This central region may be defined as defined previously in relation to FIG. 3a. In the specific arrangement of FIG. 4, the crossover region 418 connects a second end of the first turn of the first loop 412 to a first end of the first turn of the second loop 413. The crossover region 418 also connects a second end of the second turn of the second loop 417 to a first end of the second turn of the first loop 416. Finally the crossover section 418 also connects a second end of the second turn of the first loop 414 to a second end of the second turn of the second loop 415. In FIG. 4, all the cross-overs of the inductor sections connecting the turns of the loops occur in the central region of the figure-of-8 structure. In other words, the first turn of the first loop 403 and the first turn of the second loop 405 are connected by the crossover section 418 such that they form a first figure-of-8 shape. The second turn of the first loop 404 and the second turn of the second loop 406 are connected by the crossover section such that they form a second figure-of-8 shape. The first and second figure-of-8 shapes are connected to each other in the crossover section 418.

Excluding the crossover section, the second figure-of-8 shape lies parallel to and circumscribes the first figure-of-8 shape, such that the first figure-of-8 shape faces the interior of the overall inductor structure and the second figure-of-8 shape faces the exterior of the overall inductor structure.

As described in relation to FIG. 3a, the inductor operates using alternating current. As with the description of FIG. 3a, only one current direction will be described below. It will be understood that the converse operation applies when the current alternates direction.

Current enters the inductor via the first feed line 408. The current flows around the inductor in the directions indicated by the arrows on FIG. 4. The current leaves the inductor via the second feed line 409. As in FIG. 3a, the first loop 401 and the second loop 402 are connected such that current flowing from the first feed line 408 to the second feed line 409 circulates in a first rotational direction around the first loop 401 and in a second opposite rotational direction around the second loop 402. The current flows in the same direction around each of the first 403 and second 404 turns of the first loop 401. The current flows in the same direction around each of the first 405 and second 406 turns of the second loop 402. In the embodiment depicted in FIG. 4, the current flows in an anticlockwise direction around the first loop 401 and in a clockwise direction around the second loop 402 as indicated by the arrows on the figure.

The magnetic field components of the two loops 401, 402 cancel along the first axis 407 in the same manner as described in relation to FIG. 3a.

In preferred embodiments, the inductor structure of FIG. 4 further comprises a shield 426 and a centre tap 428 as described in relation to FIG. 3a.

It will be appreciated by a person skilled in the art that the scope of the present invention extends to including a figure-of-8 inductor comprising any number of turns in each of the loops.

In preferred embodiments of the invention, the inductor is formed by metallisation on a planar substrate. Suitably, the inductor is formed on an integrated circuit.

Solid metal objects may be used in the shield 326 in order to limit the propagation of currents in the substrate surface. The shield may be fabricated from a set of concentric broken metal rings. The metal rings are broken in order to avoid a shorted winding around the inductor. Alternatively, the shield may be fabricated from a dummy metal fill on all the metal layers. The dummy metal fill comprises small metal particles that are not in electrical contact with one another. The metal particles may be square in shape. This method is used primarily to prevent problems associated with sagging in low density areas, for example the inside of the inductor. It may be necessary to use this method to conform to manufacturing quality controls. A further alternative is not to use the shield at all. In such a case, the metal fill and/or active and passive components are used inside the area encompassed by the inductor.

The inductor may be defined by, and preferably exclusively by, electrically conductive material: preferably material metallic leads or tracks. Preferably the leads or tracks are defined on or through a substrate of electrically insulating material.

The feed lines may be defined by, and preferably exclusively by, electrically conductive material: preferably metallic leads or tracks. Preferably the leads or tracks are defined on or through a substrate of electrically insulating material.

The inductor of the present invention may be used in an environment in which it is desired to isolate the inductor's magnetic field from another component. In such an environment, the inductor and the other component should preferably be arranged such that the relative orientation of the other components is along the first axis 307,407 of the inductor. This is because the most effective cancellation of the inductor's magnetic field is achieved along its first axis 307,407. The other component may be an inductor and it may be desirable to eliminate the electromagnetic coupling between the two inductors.

The inductor of the present invention could be suitably implemented in a voltage controlled oscillator (VCO). In such an implementation, the feed lines connect the inductor to the rest of the VCO and the centre tap connects the inductor to a DC supply voltage. The VCO could suitably be used for providing a steady frequency oscillating signal to a mixer[s] for use in a transmit and/or receive chain of a transceiver. It may be desired to reduce the mutual electromagnetic coupling between the inductor of the VCO and another component in the transceiver. This other component may be another inductor. The other component may be an inductor in another VCO of the transceiver.

The inductor of the present invention could also be suitably implemented in a balun. A balun converts between balanced and unbalanced signals in an environment in which it is desirable to isolate the inductor's magnetic field from the surrounding circuitry in order to avoid interference problems arising from electromagnetic coupling.

The applicant draws attention to the fact that the present invention may include any feature or combination of features disclosed herein either implicitly or explicitly or any generalisation thereof, without limitation to the scope of any of the present claims. In view of the foregoing description it will be evident to a person skilled in the art that various modifications may be made within the scope of the invention.

The invention claimed is:

1. An inductor structure for incorporation on a chip into an integrated circuit comprising:
   a first loop and a second loop;
   a first feed line connected to a first end of the first loop and a second feed line connected to a first end of the second loop, wherein the first feed line extends through an area circumscribed by one of the first and second loops and the second feed line extends through an area circumscribed by the same one of the first and second loops; and
   a crossover section adjacent to the first end of the first loop and the first end of the second loop, the crossover section coupling the first loop to the second loop so as to cause current flowing from the first feed line to the second feed line to circulate around the first loop in a first rotational direction and around the second loop in a second rotational direction opposite to the first rotational direction.

2. An inductor structure as claimed in claim 1, wherein each of the first and second feed lines extends to an exterior edge of the one of the first and second loops through which it extends.

3. An inductor structure as claimed in claim 1, wherein the area circumscribed by the first loop is equal to an area circumscribed by the second loop.

4. An inductor structure as claimed in claim 1, wherein the first loop has identical size and shape to the second loop.

5. An inductor structure as claimed in claim 1, wherein the inductor structure is symmetrical about a first axis that bisects the inductor structure such that the first loop is on one side of the axis and the second loop is on a second side of the axis.

6. An inductor structure as claimed in claim 1, wherein the inductor structure is symmetrical about a second axis that bisects the inductor structure such that a first half of the first loop and a first half of the second loop lie on one side of the second axis and a second half of the first loop and a second half of the second loop lie on a second side of the second axis.

7. An inductor structure as claimed in claim 1, wherein each of the first and second loops comprises a first turn and a second turn.

8. An inductor structure as claimed in claim 1, wherein the first loop and the second loop are connected to form a figure-of-8 shape.

9. An inductor structure as claimed in claim 1, wherein the inductor structure is formed by metallization on a planar substrate.

10. An inductor structure comprising:
a first loop and a second loop;
a first feed line connected to a first end of the first loop at the centre of the inductor structure and a second feed line connected to a first end of the second loop at the centre of the inductor structure, each of the first and second feed lines extending out of the plane of the inductor structure; and
a crossover section adjacent to the first end of the first loop and the first end of the second loop, the crossover section coupling the first loop to the second loop so as to cause current flowing from the first feed line to the second feed line to circulate around the first loop in a first rotational direction and around the second loop in a second rotational direction opposite to the first rotational direction, wherein the facing edges of the first and second loops are parallel, the facing edges being those adjacent to an axis which divides the inductor structure such that the first loop is on one side of the axis and the second loop is on the other side of the axis.

11. An inductor structure as claimed in claim 10, wherein the first feed line extends out of the plane of the inductor structure from the first end of the first loop and the second feed line extends out of the plane of the inductor structure from the first end of the second loop.

12. An inductor structure as claimed in claim 10, wherein the area circumscribed by the first loop is equal to an area circumscribed by the second loop.

13. An inductor structure as claimed in claim 10, wherein the first loop has identical size and shape to the second loop.

14. An inductor structure as claimed in claim 10, wherein the inductor structure is symmetrical about a first axis that bisects the inductor structure such that the first loop is on one side of the axis and the second loop is on a second side of the axis.

15. An inductor structure as claimed in claim 10, wherein the inductor structure is symmetrical about a second axis that bisects the inductor structure such that a first half of the first loop and a first half of the second loop lie on one side of the second axis and a second half of the first loop and a second half of the second loop lie on a second side of the second axis.

16. An inductor structure as claimed in claim 10, wherein each of the first and second loops comprises a first turn and a second turn.

17. An inductor structure as claimed in claim 10, wherein the first loop and the second loop are connected to form a figure-of-8 shape.

18. An inductor structure as claimed in claim 10, wherein the inductor structure is formed by metallization on a planar substrate.

* * * * *